United States Patent
Lee (10) Patent No.: US 7,436,036 B2
(45) Date of Patent: Oct. 14, 2008

(54) PMOS TRANSISTOR OF SEMICONDUCTOR DEVICE, SEMICONDUCTOR DEVICE COMPRISING THE SAME, AND METHOD FOR MANUFACTURING THE SAME

(75) Inventor: Jung Suk Lee, Seoul (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 168 days.

(21) Appl. No.: 11/502,920

(22) Filed: Aug. 11, 2006

(65) Prior Publication Data
US 2007/0257309 A1 Nov. 8, 2007

(30) Foreign Application Priority Data
May 3, 2006 (KR) ............... 10-2006-0040110

(51) Int. Cl.
*H01L 29/76* (2006.01)
(52) U.S. Cl. ............... 257/411; 257/369; 257/E27.062; 257/E27.064; 438/216
(58) Field of Classification Search ........... 257/411, 257/E27.062
See application file for complete search history.

(56) References Cited

U.S. PATENT DOCUMENTS

| 6,621,114 | B1 | 9/2003 | Kim et al. | |
|---|---|---|---|---|
| 6,787,421 | B2 | 9/2004 | Gilmer | 438/275 |
| 6,890,811 | B2 | 5/2005 | Hou et al. | 438/216 |
| 2005/0098839 | A1* | 5/2005 | Lee et al. | 257/410 |
| 2005/0148127 | A1* | 7/2005 | Jung et al. | 438/197 |
| 2006/0214207 | A1* | 9/2006 | Nabatame et al. | 257/295 |
| 2007/0004080 | A1* | 1/2007 | Ouyang | 438/106 |

FOREIGN PATENT DOCUMENTS

KR 2005-0054920 6/2005

* cited by examiner

*Primary Examiner*—Tu-Tu V Ho
(74) *Attorney, Agent, or Firm*—Marshall, Gerstein & Borun LLP

(57) ABSTRACT

A PMOS transistor of a semiconductor device exhibiting improved characteristics, a semiconductor device incorporating the same, and a method for manufacturing the semiconductor device. The PMOS transistor incorporates a first gate insulation film formed in a predetermined region on a semiconductor substrate and comprising a hafnium-based oxide, a second gate insulation film formed on the first gate insulation film for shielding reaction between hafnium and silicon, and a gate conductive film formed on the second gate insulation film and comprising polysilicon.

11 Claims, 5 Drawing Sheets

PMOS TRANSISTOR OF SEMICONDUCTOR DEVICE, SEMICONDUCTOR DEVICE COMPRISING THE SAME, AND METHOD FOR MANUFACTURING THE SAME

BACKGROUND OF THE INVENTION

1. Field of the Invention

The invention relates to a PMOS transistor of a semiconductor device, which exhibits improved characteristics, a semiconductor device incorporating the same, and a method for manufacturing the semiconductor device.

2. Description of the Related Art

As a result of ongoing high integration and refinement of semiconductor devices, there is a continuous need for enhancement in characteristics of transistors. Particularly, in order to further improve capacitance, it has been attempted to develop a thinner gate insulation film which comprises an insulation material such as silicon oxide ($SiO_2$).

However, reduction in thickness of the gate insulation film can cause direct tunneling, which increases current leakage, thereby causing several problems such as increase of power consumption, significant decrease in reliability of the gate insulation film, and so on.

In the related art, there are attempts to form a gate insulation film using an insulation material having higher dielectric constant than that of silicon oxide in order to secure a sufficient thickness of the gate insulation film while further enhancing the capacitance. One of the attempts is to form a gate insulation film using a hafnium-based oxide.

In this case, it is known that performance of the transistor deteriorates due to shift of a threshold voltage when applying a gate conductive film comprising polysilicon thereto (see Electronic Journal July 2005). For example, an NMOS transistor requires a threshold voltage of about 0.2 V to about 0.3 V, and a PMOS transistor requires a threshold voltage of about −0.2 V to about 0.3 V. However, when the gate insulation film is formed of a hafnium-based oxide, followed by applying a gate conductive film comprising polysilicon thereto, the threshold voltage of the PMOS transistor is shifted by about 0.6 V to about 0.7 V, and the threshold voltage of the NMOS transistor is also shifted by about 0.2 V to about 0.25 V, thereby deteriorating the performance of the transistor.

Fermi level pinning can be mentioned as one of major causes of the threshold voltage shift. Although the detailed mechanism of the Fermi level pinning has not yet been clearly described, many opinions report that it is directly caused by reaction between silicon and hafnium at an interface between the gate conductive film comprising the polysilicon and the gate insulation film formed of the hafnium-based oxide film. In other words, electrons are formed along with holes in the gate insulation film due to junction of silicon and hafnium, and move towards the polysilicon, thereby creating interfacial polarization. As a result, Fermi level pinning occurs from the gate insulation film comprising polysilicon so that the threshold voltage is shifted, thereby deteriorating performance of the transistor. In particular, such a phenomenon is remarkable in the PMOS transistor which comprises p-type polysilicon, and the gate conductive film comprising the same.

SUMMARY OF THE INVENTION

The invention provides a PMOS transistor of a semiconductor device, which incorporates a gate insulation film formed of an insulation material having a high dielectric constant, and prevents deterioration in performance caused by shift of a threshold voltage, exhibiting enhanced characteristics.

The invention also provides a semiconductor device incorporating the PMOS transistor, and a method for manufacturing the same.

In accordance with one aspect of the invention, a PMOS transistor of a semiconductor device is provided. The PMOS transistor comprises: a first gate insulation film formed in a predetermined region on a semiconductor substrate and comprising a hafnium-based oxide; a second gate insulation film formed on the first gate insulation film for shielding reaction between hafnium and silicon; and a gate conductive film formed on the second gate insulation film and comprising polysilicon.

The hafnium-based oxide preferably may comprise any one of $HfO_2$, $HfSiO_x$, $HfAlO_x$, and $HfSiON$.

The second gate insulation film preferably may comprise an insulation material, for example $Al_2O_3$, having a higher dielectric constant than that of $SiO_2$.

In accordance with another aspect of the invention, a semiconductor device is provided, comprising: an NMOS transistor formed on a first region of a semiconductor substrate, and including a first gate insulation film comprising a hafnium-based oxide, a third gate insulation film, and a gate conductive film comprising polysilicon sequentially stacked on the semiconductor substrate; and a PMOS transistor formed on a second region of the semiconductor substrate, and including a first gate insulation film comprising the hafnium-based oxide, a second gate insulation film for shielding reaction between hafnium and silicon, and a gate conductive film comprising polysilicon sequentially stacked on the semiconductor substrate.

The hafnium-based oxide preferably may comprise any one of $HfO_2$, $HfSiO_x$, $HfAlO_x$, and $HfSiON$.

The second gate insulation film preferably may comprise an insulation material, for example $Al_2O_3$, having a higher dielectric constant than that of $SiO_2$.

The second and third gate insulation films preferably may comprise an insulation material having a higher dielectric constant than that of $SiO_2$. For example, the second gate insulation film may comprise $Al_2O_3$, and the third gate insulation film may comprise the hafnium-based oxide.

In accordance with yet another aspect of the invention, a method for manufacturing a semiconductor device is provided, comprising the steps of: providing a semiconductor substrate having a first region to form an NMOS transistor thereon, and a second region to form a PMOS transistor thereon; forming a first gate insulation film comprising a hafnium-based oxide on the semiconductor substrate; forming a second gate insulation film for shielding reaction between hafnium and silicon on the first gate insulation film of the second region; forming a third gate insulation film on the first gate insulation film of the first region; forming a gate conductive film comprising polysilicon on the second and third gate insulation films; patterning the first and third gate insulation films, and the gate conductive film on the first region; and patterning the first and second gate insulation films, and the gate conductive film on the second region.

The hafnium-based oxide preferably may comprise any one of $HfO_2$, $HfSiO_x$, $HfAlO_x$, and $HfSiON$.

The second gate insulation film preferably may comprise an insulation material, for example $Al_2O_3$, having a higher dielectric constant than that of $SiO_2$.

The second and third gate insulation films preferably may comprise an insulation material having a higher dielectric constant than that of $SiO_2$. For example, the second gate insulation film may comprise $Al_2O_3$, and the third gate insulation film may comprise the hafnium-based oxide.

The first gate insulation film preferably may be formed by atomic layer deposition (ALD).

The second gate insulation film forming step preferably may comprise: forming a first mask pattern on the first gate insulation film to selectively expose the second region; depositing the second gate insulation film on the first gate insulation film of the second region; and removing the first mask pattern. At this point, the first mask pattern may comprises a polyimide-based photoresist pattern, and the second gate insulation film may be deposited at a temperature of, for example, about 200° C. to about 300° C. by ALD.

The third gate insulation film forming step preferably may comprise: forming a second mask pattern on the first gate insulation film to selectively open the first region; depositing the third gate insulation film on the first gate insulation film of the first region; and removing the second mask pattern. At this point, the first mask pattern may comprise a polyimide-based photoresist pattern, and the second gate insulation film may be deposited by ALD.

BRIEF DESCRIPTION OF THE DRAWINGS

The invention will be more clearly understood from the following detailed description taken in conjunction with the accompanying drawings, in which.

DESCRIPTION OF THE PREFERRED EMBODIMENTS

Preferred embodiments of the invention are described below with reference to the accompanying drawings. Many modifications and variations described hereinafter can be made by those skilled in the related art without departing from the scope of the invention, and the embodiments are provided for illustrative and exemplary purposes without limiting the scope of the invention.

For clear illustration of the invention, the thickness of each component is exaggerated, reduced, or briefly illustrated in the drawings through which like components are denoted by like reference numerals.

Figure 1:
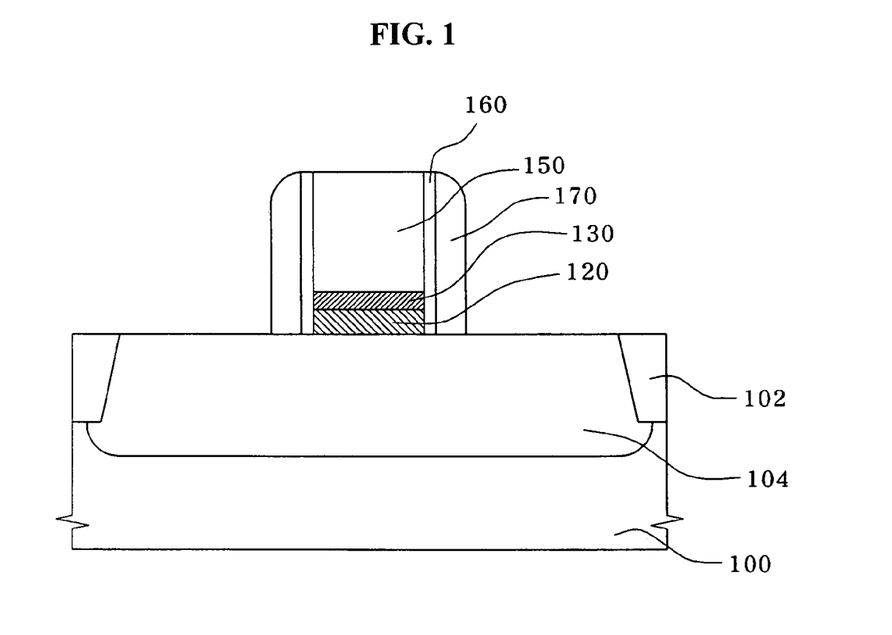
FIG. 1 is a schematic view illustrating the configuration of a PMOS transistor of a semiconductor device in accordance with one embodiment of the invention.

First, a PMOS transistor of a semiconductor device according to one embodiment of the invention is described in detail below. FIG. 1 schematically shows the PMOS transistor of the semiconductor device according to the embodiment.

Referring to FIG. 1, the PMOS transistor is formed with a device isolation layer 102 for dividing an active region and a device isolation region, and a well 104 in a semiconductor substrate 100. The well 104 may be an N-well.

A first gate insulation film 120 is formed on a predetermined region of the semiconductor substrate 100. The first gate insulation film 120 comprises a hafnium-based oxide which has a high dielectric constant. The hafnium-based oxide may be one selected from $HfO_2$, $HfSiO_x$, $HfAlO_x$, and HfSiON. In addition, the first gate insulation film 120 may comprise any of hafnium-based oxides so long as it has a higher dielectric constant than that of silicon oxide ($SiO_2$).

A second gate insulation film 130 is formed on the first gate insulation film 120. The second gate insulation film 130 is formed between the first gate insulation film 120 and a gate conductive film 150, and serves to shield reaction between hafnium of the hafnium-based oxide contained in the first gate insulation film 120 and silicon of polysilicon contained in the gate conductive film 150. With this structure, the reaction between hafnium and silicon at an interface between the gate insulation film and the gate conductive film is shielded, so that Fermi level pinning and threshold voltage shift caused thereby are reduced.

The second gate insulation film 130 may comprise any of insulation materials, which effectively shield the reaction between hafnium and silicon, and do not cause the Fermi level pinning in itself. Additionally, since the second gate insulation film 130 also serves as a gate insulation film of a transistor along with the first gate insulation film 120, it is desirable that the second gate insulation film 130 comprises an insulation material having a higher dielectric constant than that of silicon oxide ($SiO_2$). For example, the second gate insulation film 130 preferably comprises aluminum oxide ($Al_2O_3$). Aluminum oxide (relative dielectric constant=7) has a higher dielectric constant than that of silicon oxide (relative dielectric constant=4). In addition, though the aluminum oxide exhibits a lower mobility than the hafnium-based oxide, it is found that the aluminum oxide does not exhibit the Fermi level pinning.

The gate conductive film 150 is formed on the second gate insulation film 130. The gate conductive film 150 preferably comprises polysilicon, since polysilicon can be easily deposited via a general LPCVD without damaging a thin film in comparison to other conductive materials and has a high etching selectivity.

The transistor of the semiconductor device may further comprise buffer oxide films 160 and gate spacers 170 formed at both sides of the first gate insulation film 120, second gate insulation film 130, and gate conductive film 150.

According to the invention, since the transistor of the semiconductor device is formed with the gate insulation film which comprises the insulation material having a higher dielectric constant than that of silicon oxide, that is, the hafnium-based oxide and optionally aluminum oxide, the thickness of the gate insulation film can be sufficiently secured, thereby preventing direct tunneling and an increase of current leakage resulting from the direct tunneling while further enhancing capacitance of the transistor. Furthermore, since the second gate insulation film 130 comprising, for example, aluminum oxide, is formed between the first gate insulation film 120 and the gate conductive film 150, it is possible to prevent direct contact of hafnium and silicon, which is caused by reaction therebetween at the interface between the gate insulation film and the gate conductive film 150. As a result, the Fermi level pinning and the threshold voltage shift resulting therefrom can be reduced. Thus, according to the embodiment, the PMOS transistor of the semiconductor device exhibiting enhanced characteristics can be provided.

Particularly, since the structure as described above is applied to the PMOS transistor of the semiconductor suffering from problems caused by the Fermi level pinning and the threshold voltage shift resulting therefrom, it is possible to effectively suppress deterioration in performance of the transistor caused by the threshold voltage shift.

Figure 2:
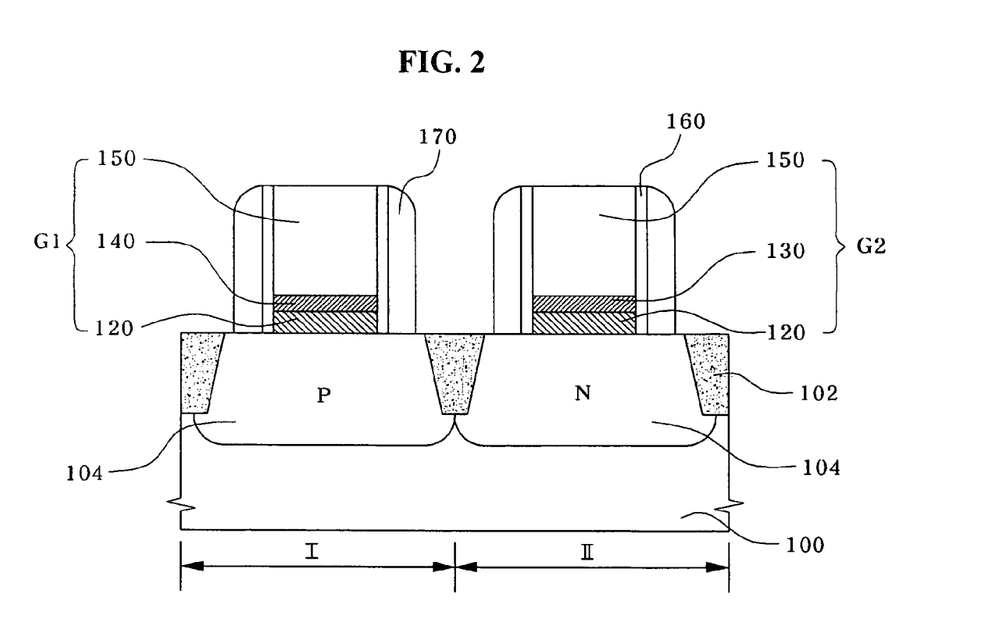
FIG. 2 is a schematic view illustrating the configuration of a semiconductor device in accordance with one embodiment of the invention.

Next, a semiconductor device according to one embodiment of the invention is described below. FIG. 2 schematically shows the semiconductor device according to the embodiment.

Referring to FIG. 2, the semiconductor device according to the embodiment comprises a semiconductor substrate 100, which is divided into a first region I in which an NMOS transistor G1 will be formed, and a second region II in which a PMOS transistor G2 will be formed.

The semiconductor substrate 100 is formed with device isolation layers 102 for dividing active regions and device isolation regions, and with wells 104. More specifically, a P-well is formed in the first region I of the semiconductor substrate 100, and an N-well is formed in the second region II of the semiconductor substrate 100.

On the second region II of the semiconductor substrate 100, the PMOS transistor G2 is formed by sequentially stacking a first gate insulation film 120 comprising a hafnium-based oxide, a second gate insulation film 130 for shielding reaction between hafnium and silicon, and a gate conductive film 150 comprising polysilicon. The PMOS transistor G2 may further comprise buffer oxide films 160 and gate spacers 170 formed at both sides of the first gate insulation film 120, second gate insulation film 130, and gate conductive film 150. As such, since the PMOS transistor G2 has the same structure as that of the PMOS transistor of the semiconductor device shown in FIG. 1, further detailed description thereof is omitted.

Meanwhile, on the first region I of the semiconductor substrate 100, the NMOS transistor G1 is formed by sequentially stacking a first gate insulation film 120 comprising the hafnium-based oxide, a third gate insulation film 140, and a gate conductive film 150 comprising polysilicon. The NMOS transistor G1 may also further comprise buffer oxide films 160 and gate spacers 170 formed at both sides of the first gate insulation film 120, third gate insulation film 140, and gate conductive film 150.

In the NMOS transistor G1, the first gate insulation film 120 comprises the hafnium-based oxide which has a high dielectric constant. For example, the hafnium-based oxide may be one selected from $HfO_2$, $HfSiO_x$, $HfAlO_x$, and HfSiON. In addition, the first gate insulation film 120 may comprise any of hafnium-based oxides so long as it has higher dielectric constant than that of silicon oxide ($SiO_2$).

Since the third gate insulation film 140 also serves as a gate insulation film of the NMOS transistor along with the first gate insulation film 120, it may comprise an insulation material having a higher dielectric constant than that of silicon oxide ($SiO_2$). For example, the third gate insulation film 140 may comprise the same hafnium-based oxide as that of the first gate insulation film 120.

For the semiconductor device described above, since both the NMOS and PMOS transistors G1 and G2 of the semiconductor device are formed with the gate insulation film which comprises the insulation material having a higher dielectric constant than that of silicon oxide, that is, the hafnium-based oxide and optionally aluminum oxide, the thickness of the gate insulation film can be sufficiently secured, thereby preventing the direct tunneling and the increase of current leakage resulting from the direct tunneling while further enhancing the capacitance.

Furthermore, since the second gate insulation film 130 comprising, for example, aluminum oxide, is formed between the first gate insulation film 120 and the gate conductive film 150 in the PMOS transistor G2, it is possible to prevent direct junction of hafnium and silicon, which is caused by reaction therebetween at the interface between the gate insulation film and the gate conductive film. As a result, the Fermi level pinning and the threshold voltage shift resulting therefrom can be reduced. In particular, for the PMOS transistor G2 suffering from problems caused by the Fermi level pinning and the threshold voltage shift resulting therefrom, it is possible to effectively suppress deterioration in performance of the transistor caused by the threshold voltage shift. Thus, according to the embodiment, the transistor of the semiconductor device exhibiting enhanced characteristics, and the semiconductor device comprising the same can be provided.

Lastly, a method for manufacturing a semiconductor device according to one embodiment of the invention is described. FIGS. 3 to 10 are schematic views illustrating steps of the method according to the embodiment.

Figure 3:
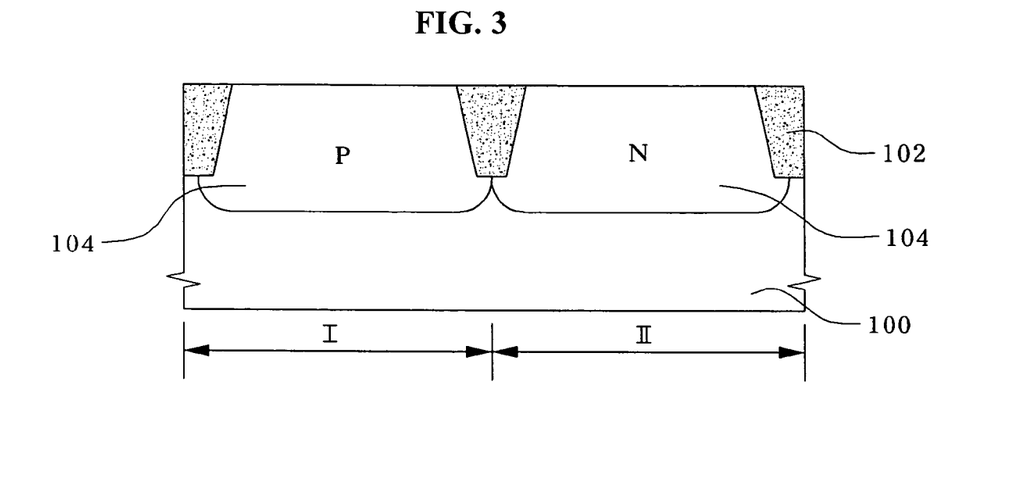
FIGS. 3 to 10 are schematic views illustrating steps of a method for manufacturing a semiconductor device in accordance with one embodiment of the invention.

At first, referring to FIG. 3, device isolation layers 102 for dividing a semiconductor substrate 100 into active regions and device isolation regions are formed in the semiconductor substrate 100 which is divided into a first region I in which an NMOS transistor will be formed, and a second region II in which a PMOS transistor will be formed. Then, the semiconductor substrate 100 is formed with wells 104. More specifically, a P-well is formed in the first region I of the semiconductor substrate 100 on which the NMOS transistor will be formed, and an N-well is formed in the second region II of the semiconductor substrate 100 on which the PMOS transistor will be formed.

Figure 4:
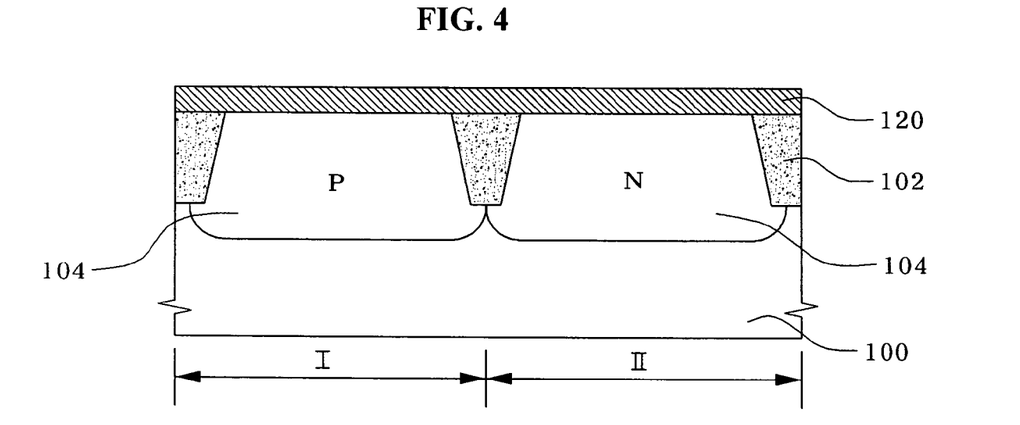

Next, referring to FIG. 4, a first gate insulation film 120 comprising a hafnium-based oxide is formed on the semiconductor substrate 100. The hafnium-based oxide may be any one of, for example, $HfO_2$, $HfSiO_x$, $HfAlO_x$, HfSiON and the like, which has a higher dielectric constant than that of silicon oxide. The first gate insulation film comprising the hafnium-based oxide may be formed through deposition using ALD. The first gate insulation film may have a thickness of, for example, about 20 Å to about 25 Å.

After forming the first gate insulation film 120, a second gate insulation film 130 for shielding reaction between hafnium and silicon is formed on the first gate insulation film in the second region II through following processes.

Figure 5:
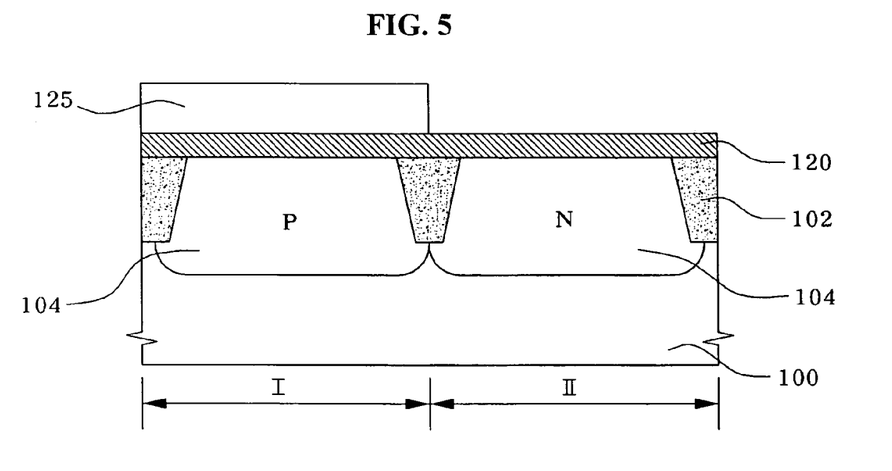
Figure 6:
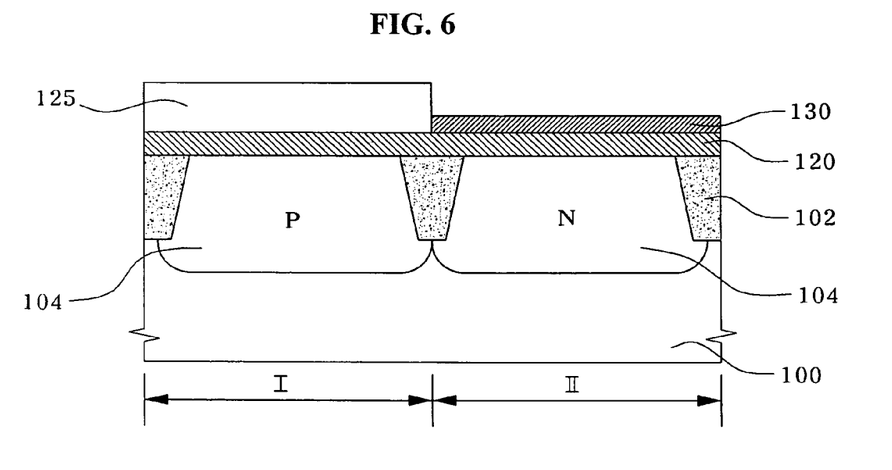

Referring to FIG. 5, a first mask pattern 125 is formed on the first gate insulation film 120 to selectively open the second region II. Then, as shown in FIG. 6, the second gate insulation film 130 for selectively shielding the reaction between hafnium and silicon is formed on the first gate insulation film of the second region II which is opened through the first mask pattern 125.

At this time, the second gate insulation film 130 may comprise any of insulation materials, which effectively shield the reaction between hafnium and silicon, and do not cause the Fermi level pinning in itself. Additionally, since the second gate insulation film 130 also serves as a gate insulation film of the PMOS transistor along with the first gate insulation film 120, it is desirable that the second gate insulation film 130 comprise an insulation material having a higher dielectric constant than that of silicon oxide ($SiO_2$). For example, the second gate insulation film 130 preferably comprises aluminum oxide ($Al_2O_3$). Aluminum oxide (relative dielectric constant=7) has a higher dielectric constant than that of silicon oxide (relative dielectric constant=4). In addition, the aluminum oxide exhibits a lower mobility than the hafnium-based oxide, it is found that the aluminum oxide does not exhibit the Fermi level pinning.

The first mask pattern 125 used for forming the second gate insulation film 130 using the insulation material such as aluminum oxide is preferably formed through exposure and development of a polyimide-based photoresist, and the second gate insulation film 130 is preferably deposited using the ALD at a temperature of, for example, about 200° C. to about 300° C., for reasons described below.

Generally, an insulation material such as aluminum oxide is deposited at a temperature of 180° C. or more. However, a general photoresist suffers from reflow and burn-in at a temperature of 140° C. or more, which can cause contamination of deposition equipment during this process. As a result, the general photoresist cannot be advantageously used in the deposition process for the second gate insulation film 130. In comparison to such a general photoresist, the polyimide-based photoresist can be maintained stably even at a temperature of 450° C. or more without suffering from the reflow or the burn-in, and thus generally does not serve as a contaminant source with respect to the deposition equipment. In addition, since the insulation material such as aluminum oxide can be deposited with the ALD at a temperature of about 200° C. to about 350° C., the first mask pattern 125 is formed using the polyimide-based photoresist, while the second gate insulation film 130 is deposited using the ALD at the temperature of, for example, about 200° C. to about 300° C., thereby enabling the second gate insulation film 130 to be formed stably.

The second gate insulation film 130 is preferably deposited to a thickness of about 5 Å to about 7 Å.

Figure 7:
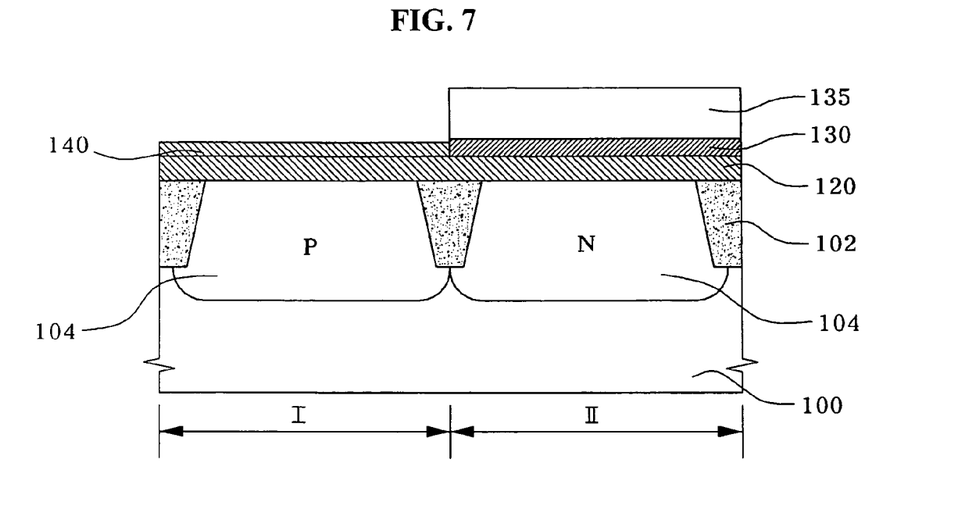

After forming the second gate insulation film 130 with the process as described above, the first mask pattern 125 is removed, and a third gate insulation film 140 is formed on the first gate insulation film of the first region I through the following processes.

Referring to FIG. 7, a second mask pattern 135 is formed on the first gate insulation film 120 to selectively open the first region I. Then, the third gate insulation film 140 is selectively deposited on the first gate insulation film 120 of the first region I which is opened through the second mask pattern 135.

At this time, since the third gate insulation film 140 also serves as a gate insulation film for the NMOS transistor along with the first gate insulation film 120, it may comprises the insulation material having a higher dielectric constant than that of silicon oxide ($SiO_2$). For example, the third gate insulation film 140 comprises the same hafnium-based oxide as that of the first gate insulation film 120.

The second mask pattern 135 used for selectively forming the third gate insulation film 140 is preferably formed through exposure and development of the polyimide-based photoresist, and the third gate insulation film 140 is preferably deposited using the ALD at a temperature as low as possible. The reason is the same as that described for the second insulation film 130. As a result, the third gate insulation film 140 can be deposited stably.

In order to allow the gate insulation films of the PMOS and NMOS transistors to have the same thickness, the third gate insulation film 140 may be deposited to a thickness of about 5 Å to about 7 Å as in the second gate insulation film 130.

Figure 8:
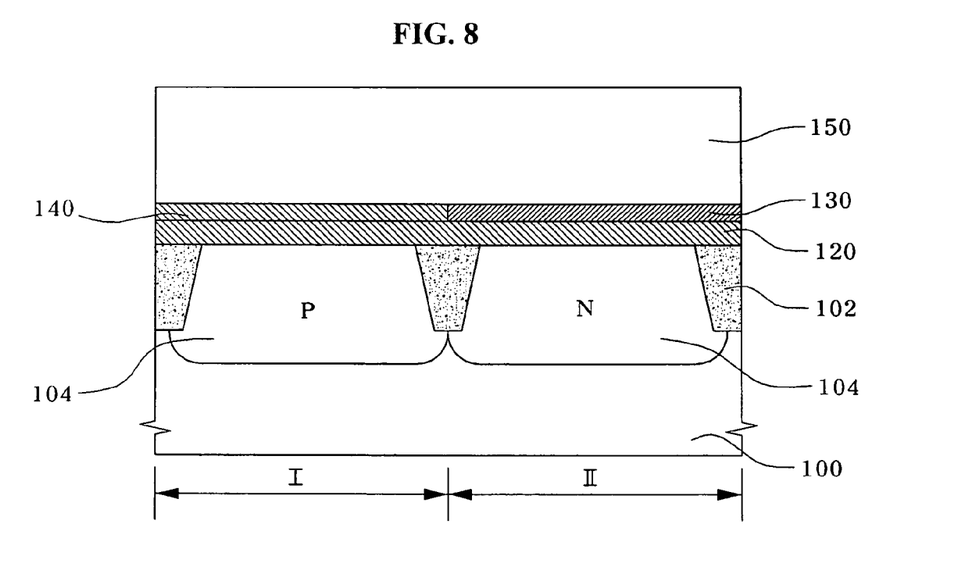

After forming the third gate insulation film 140, the second mask pattern 135 is removed, and, as shown in FIG. 8, a gate conductive film 150 comprising polysilicon is formed on the second and third gate insulation films 130 and 140. The gate conductive film 150 may be deposited to a thickness of, for example, about 600 Å to about 800 Å.

Figure 9:
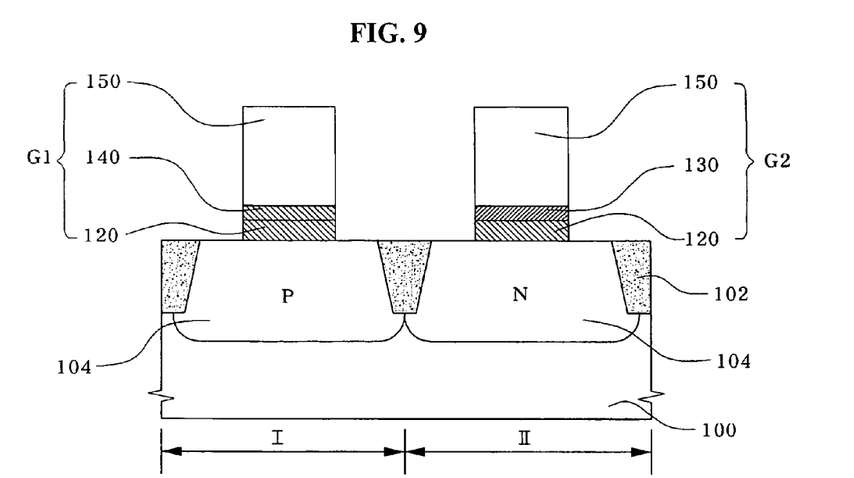

Then, as shown in FIG. 9, the first and third gate insulation films 120 and 140, and the gate conductive film 150 sequentially stacked in the first region I are subjected to a patterning process along with the first and second gate insulation films 120 and 130, and the gate conductive film 150 sequentially stacked in the second region II.

Although not shown in the drawings, during the patterning process, a hard mask nitride film, and a photoresist are sequentially formed on the gate conductive film 150, followed by exposure and development for the photoresist so as to have a predetermined pattern. Then, the hard mast nitride film is etched to a predetermined pattern using the patterned photoresist as a mask. Next, the first and third gate insulation films 120 and 140, and the gate conductive film 150 in the first region I, and the first and second gate insulation films 120 and 130, and the gate conductive film 150 in the second region II are etched to a predetermined pattern using the patterned hard mask nitride film as a mask. At this time, the hard mask nitride film may be formed to a thickness of about 1,700 Å to about 1,900 Å.

In addition, in order to suppress damage of the photoresist due to scattered reflection at a lower portion of the photoresist during the exposure of the photoresist, an anti-reflective film may be formed to a thickness of, for example, about 650 Å to about 750 Å between the photoresist and the hard mask nitride film.

Figure 10:
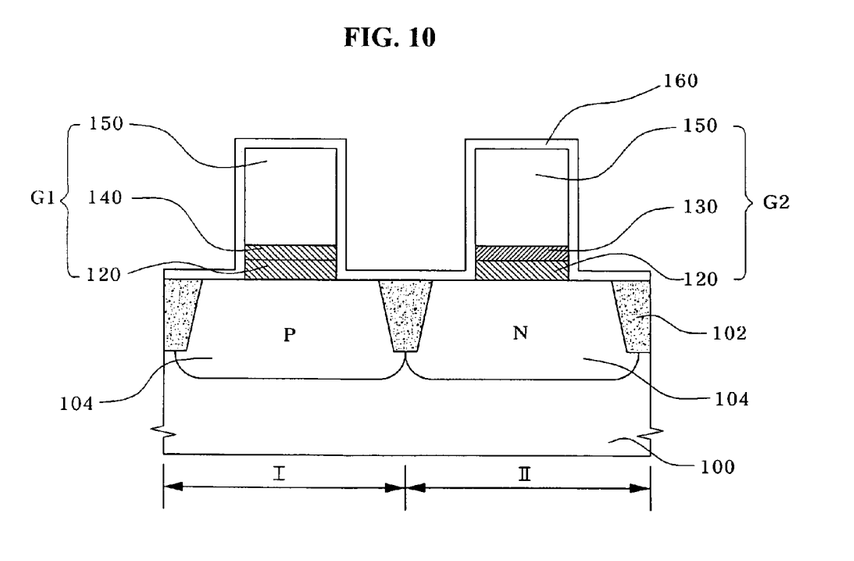

After patterning the insulation films and the gate conductive film 150, a buffer oxide film 160 is formed on an entire surface of the resultant having the predetermined pattern, as shown in FIG. 10. The buffer oxide film 160 may be formed to a thickness of, for example, about 50 Å to about 60 Å. Next, a gate spacer 170 is formed on the resultant having the buffer oxide film 160 formed thereon, thereby producing a semiconductor device as shown in FIG. 2.

As described above, for the semiconductor device produced according to the method of the invention, since both the NMOS and PMOS transistors G1 and G2 are formed with the gate insulation film which comprises the insulation material having a higher dielectric constant than that of silicon oxide, the thickness of the gate insulation film can be sufficiently secured, thereby preventing the direct tunneling and the increase of current leakage resulting therefrom while further enhancing the capacitance.

Furthermore, since the second gate insulation film 130 is formed between the first gate insulation film 120 and the gate conductive film 150 in the PMOS transistor G2, it is possible to suppress the Fermi level pinning and the threshold voltage shift resulting therefrom. In particular, for the PMOS transistor G2 significantly suffering from the problems caused by the Fermi level pinning and the threshold voltage shift resulting therefrom, it is possible to suppress deterioration in performance of the transistor by suppressing the threshold voltage shift, enabling the semiconductor device exhibiting enhanced characteristics to be produced.

As apparent from the above description, according to the invention, the transistor and the semiconductor device comprising the same comprise the gate insulation film formed of a hafnium-based oxide having a high dielectric constant while suppressing Fermi level pinning and threshold voltage shift resulting therefrom, thereby exhibiting enhanced characteristics.

The structure of the invention is applied to a PMOS transistor suffering from, particularly, the Fermi level pinning and the threshold voltage shift resulting therefrom, so that a driving current ratio of an NMOS transistor and the PMOS transistor is increased, and a width of the PMOS transistor is reduced, thereby significantly reducing the size of CMOS.

As a result, according to the invention, it is possible to provide the transistor of the semiconductor device exhibiting significantly enhanced characteristics, the semiconductor device comprising the same, and the method for manufacturing the semiconductor device.

The embodiments and the accompanying drawings as described above have been described for illustrative purposes and the invention is limited only by the following claims. Further, those skilled in the art will appreciate that various modifications, additions and substitutions are allowed without departing from the scope and spirit of the invention of the accompanying claims.

What is claimed is:

1. A method for manufacturing a semiconductor device, comprising:

providing a semiconductor substrate having a first region to form an NMOS transistor thereon, and a second region to form a PMOS transistor thereon;

forming a first gate insulation film comprising a hafnium-based oxide on the first region and second region of the semiconductor substrate;

forming a second gate insulation film for shielding reaction between hafnium and silicon on the first gate insulation film of the second region;

forming a third gate insulation film on the first gate insulation film of the first region, wherein the third gate insulation film comprises a different material from that of the second gate insulation film;

forming a gate conductive film comprising polysilicon on the second and third gate insulation films;

patterning the first and third gate insulation films, and the gate conductive film on the first region; and patterning the first and second gate insulation films, and the gate conductive film on the second region.

2. The method of claim 1, wherein the hafnium-based oxide is selected from the group consisting of $HfO_2$, $HfSiO_x$, $HfAlO_x$, and HfSiON.

3. The method of claim 1, wherein the second and third gate insulation films comprise an insulation material having a higher dielectric constant than that of $SiO_2$.

4. The method of claim 1, wherein the second gate insulation film comprises $Al_2O_3$.

5. The method of claim 1, wherein the third gate insulation film comprises the hafnium-based oxide.

6. The method of claim 1, comprising forming the first gate insulation film is formed by atomic layer deposition (ALD).

7. The method of claim 1, comprising forming the second gate insulation film forming by:

forming a first mask pattern on the first gate insulation film to selectively expose the second region;

depositing the second gate insulation film on the first gate insulation film of the second region; and removing the first mask pattern.

8. The method of claim 7, wherein the first mask pattern comprises a polyimide-based photoresist pattern, and comprising depositing the second gate insulation film by atomic layer deposition (ALD).

9. The method of claim 8, comprising depositing the second gate insulation film at a temperature of about 200° C. to about 300° C.

10. A method for manufacturing a semiconductor device, comprising:

providing a semiconductor substrate having a first region to form an NMOS transistor thereon, and a second region to form a PMOS transistor thereon;

forming a first gate insulation film comprising a hafnium-based oxide on the first region and second region of the semiconductor substrate;

forming a second gate insulation film for shielding reaction between hafnium and silicon on the first gate insulation film of the second region;

forming a second mask pattern on the first gate insulation film to selectively open the first region;

depositing a third gate insulation film on the first gate insulation film of the first region;

removing the second mask pattern;

forming a gate conductive film comprising polysilicon on the second and third gate insulation films;

patterning the first and third gate insulation films, and the gate conductive film on the first region; and patterning the first and second gate insulation films, and the gate conductive film on the second region.

11. The method of claim 10, wherein the second mask pattern comprises a polyimide-based photoresist pattern, and comprising depositing the third gate insulation film by atomic layer deposition (ALD).

* * * * *